US008466815B2

(12) United States Patent
Zhou et al.

(10) Patent No.: US 8,466,815 B2
(45) Date of Patent: Jun. 18, 2013

(54) COMBINATION INPUT UNIT

(75) Inventors: Jia-Gui Zhou, Shenzhen (CN); Kenneth Zhao, Taipei Hsien (TW); Kun-Chih Hsieh, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1061 days.

(21) Appl. No.: 12/432,688

(22) Filed: Apr. 29, 2009

(65) Prior Publication Data

US 2010/0060492 A1 Mar. 11, 2010

(30) Foreign Application Priority Data

Sep. 5, 2008 (CN) .......................... 2008 1 0304387

(51) Int. Cl.

| | |
|---|---|
| ***H03K 17/94*** | (2006.01) |
| ***H03M 11/00*** | (2006.01) |
| ***H01H 1/00*** | (2006.01) |
| ***H01H 9/00*** | (2006.01) |

(52) U.S. Cl.

USPC ................ 341/35; 341/20; 200/273; 200/313

(58) Field of Classification Search

USPC ................. 341/20–35; 200/179, 11 R, 19.07, 200/19.18, 36, 50.34, 273, 310–317

See application file for complete search history.

(56) References Cited

U.S. PATENT DOCUMENTS

| | | | | |
|---|---|---|---|---|
| 5,901,836 | A * | 5/1999 | Taniuchi | 200/316 |
| 6,998,553 | B2 * | 2/2006 | Hisamune et al. | 200/336 |
| 7,342,186 | B2 * | 3/2008 | Montalvo et al. | 200/11 R |
| 7,439,458 | B2 * | 10/2008 | Montalvo | 200/4 |
| 7,534,975 | B1 * | 5/2009 | Sharrah et al. | 200/600 |
| 2004/0242288 | A1 * | 12/2004 | Balle et al. | 455/575.1 |
| 2007/0235294 | A1 * | 10/2007 | Kang | 200/4 |
| 2008/0289941 | A1 * | 11/2008 | Kang et al. | 200/336 |

FOREIGN PATENT DOCUMENTS

| | | |
|---|---|---|
| TW | 588812 | 5/2004 |
| TW | 200511091 | 3/2005 |

* cited by examiner

*Primary Examiner* — Hai Phan
*Assistant Examiner* — Franklin Balseca
(74) *Attorney, Agent, or Firm* — Altis Law Group, Inc.

(57) ABSTRACT

A combination input unit comprises a printed circuit board, a press key, a retaining bracket, a light transmissive rotary dial, and a housing. The printed circuit board accommodates an encoder circuit, a plurality of contacts, and a plurality of light sources. The press key is disposed above the contacts, and comprises a flange thereof. The retaining bracket is fitted over the press key and connects the press key to the printed circuit board. The light transmissive rotary dial is rotatably fitted over the press key. The rotary dial is positioned above the encoder circuit, comprises at least one elastic piece for resiliently pressing the encoder circuit, and a reflective surface. Light emitted by the light sources are reflected by the reflective surface, thus to illuminate the whole rotary dial. The housing receives the press key, the rotary dial, and the printed circuit board.

3 Claims, 6 Drawing Sheets

B - B

10

COMBINATION INPUT UNIT

BACKGROUND

1. Technical Field

The present disclosure relates to an input unit.

2. Description of Related Art

Illuminated input units are common components for electronic devices. Referring to FIG. 6, an illuminated input unit according to a related art is disclosed. The illuminated input unit includes a rotary dial encoder 11, a plurality of light sources 12 positioned around the rotary dial encoder 11, a light-guiding ring 13 positioned above the light sources 12, and a rotary dial 14. The rotary dial 14 is positioned above the light-guiding ring 13, and is fixed on the rotary dial encoder 11. Light emitted by the light sources 12 passes through the light-guiding ring 13 and illuminates the rotary dial 14. Yet, the input unit has no keys, thus cannot be used in electronic devices that need keys.

What is needed is a combination input unit, which has a rotary dial and a key.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
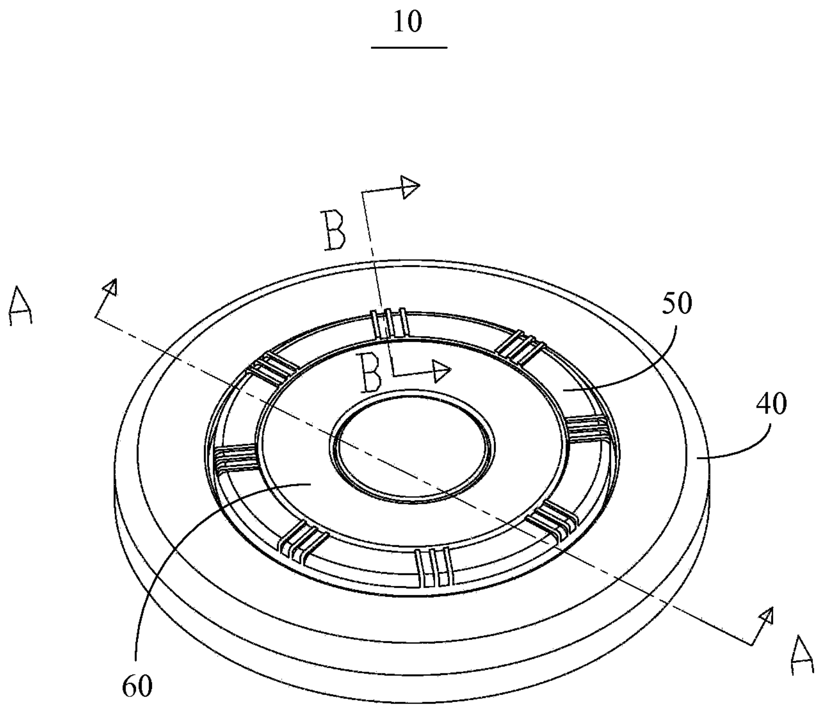
FIG. 1 is a schematic, isometric view of an input unit according to an exemplary embodiment.
Figure 2:
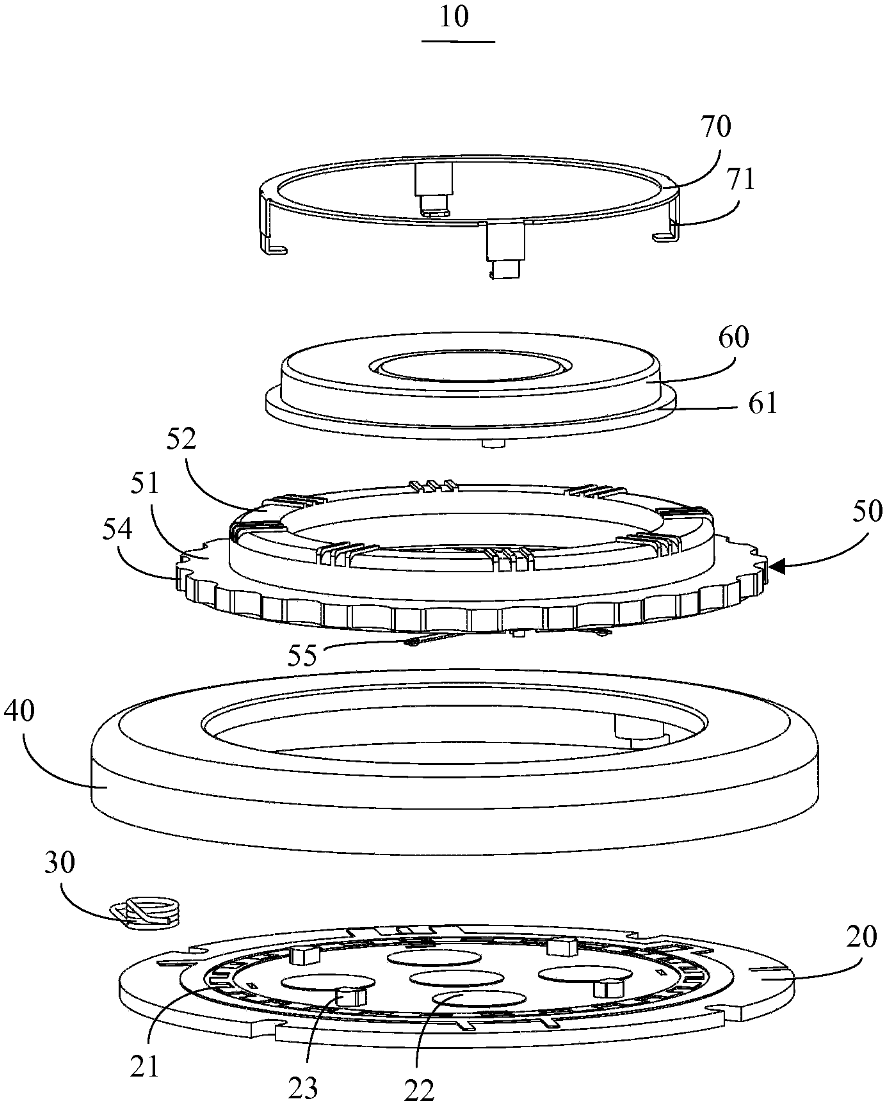
FIG. 2 is an exploded view of the input unit of FIG. 1.
Figure 3:
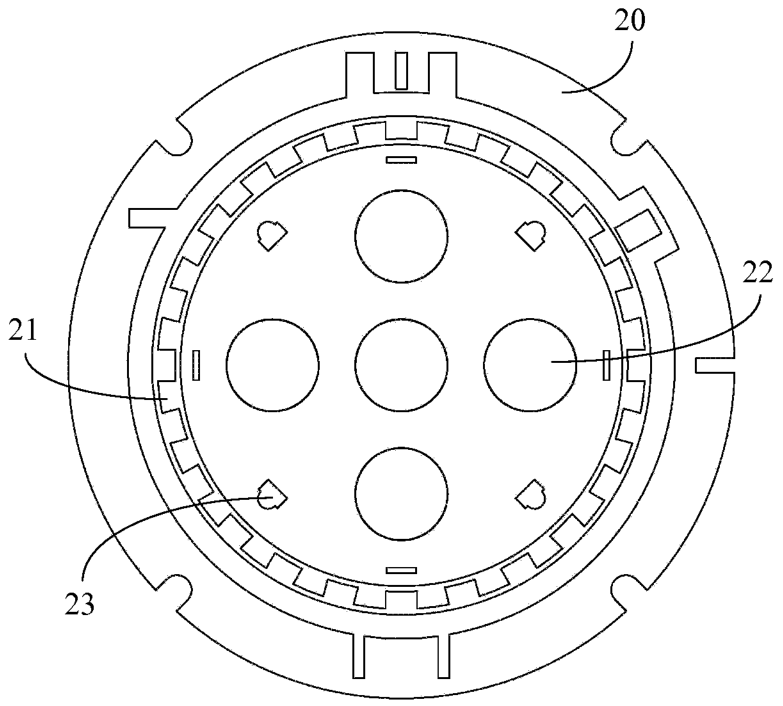
FIG. 3 is a top view of a printed circuit board of the input unit of FIG. 1.

Referring to FIGS. 1-3, a combination input unit 10 according to an exemplary embodiment is disclosed. The input unit 10 includes a printed circuit board (PCB) 20, a light transmissive rotary dial 50, a press key 60, and a housing 40.

The PCB 20 accommodates an encoder circuit 21 thereon. The encoder circuit 21 is ring shaped. The PCB 20 further accommodates a plurality of contacts 22 and light sources 23. In this embodiment, five contacts 22 are arranged as a cross. Four light emitting diodes (LED) are used as the light sources 23. The encoder circuit 21 surrounds the contacts 22 and the light sources 23.

Figure 5:
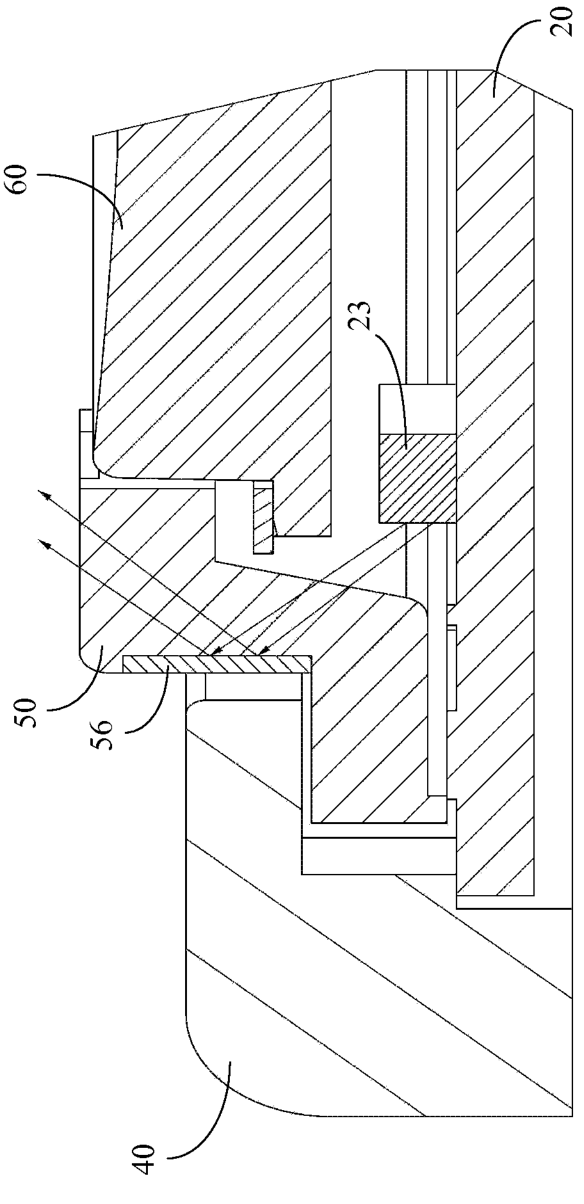
FIG. 5 is an enlarged partial section view taken along the B-B direction of FIG. 1.
Figure 6:
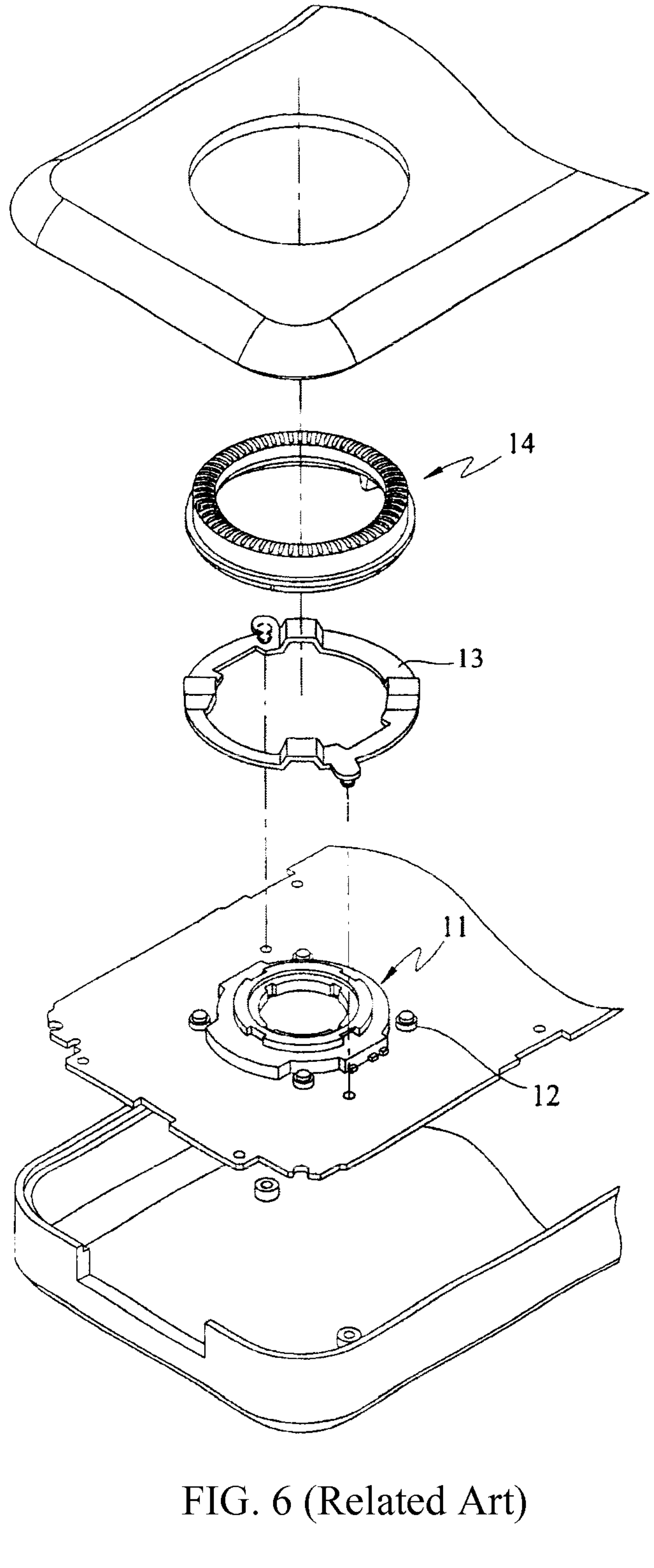
FIG. 6 (Related Art)
FIG. 6 is an exploded view of an electronic device according to a related art.

Referring also to FIGS. 2 and 5, the rotary dial 50 is positioned above the PCB 20. The rotary dial 50 includes a base part 51 and a top part 52 extended upwardly from the inner edge of the base part 51. The base part 51 is a gear including teeth 54. The top part 52 is cross-sectionally L-shaped.

The rotary dial 50 further includes at least one elastic piece 55 and a reflective surface 56. The elastic piece 55 is configured for resiliently pressing the encoder circuit 21. The elastic piece 55 is positioned beneath the bottom surface of the base part 51. The reflective surface 56 is positioned on a sidewall of the top part 52. The reflective surface 56 can be formed by painting reflective material on the sidewall of the top part 52.

Figure 4:
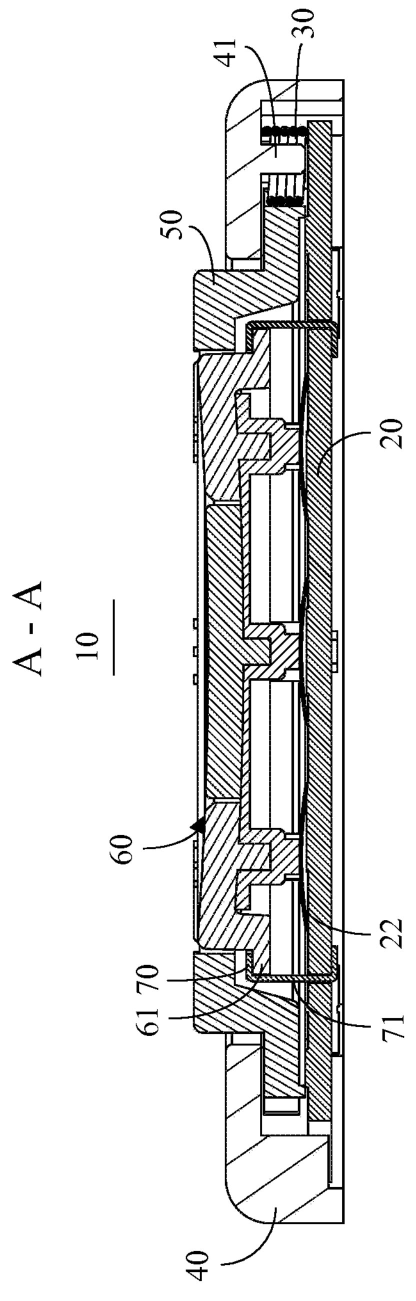
FIG. 4 is a section view taken along the A-A direction of FIG. 1.

Referring also to FIGS. 2 and 4, the press key 60 is a multi-directional press key, which is familiar to persons skilled in the art. In this embodiment, the press key 60 is cylindrical. A flange 61 is formed on the bottom of the press key 60. The press key 60 is positioned above the contacts 22. A ring shaped retaining bracket 70 is fit over the press key 60. Pins 71 extended downwardly from the bracket 70 are fixed to the PCB 20 by soldering or hooking, thus to mount the press key 60 on the PCB 20.

The housing 40 is used to receive the PCB 20, the rotary dial 50, and the press key 60. In this embodiment, the housing 40 is a ring with a generally L-shaped cross-section. The housing 40 includes a rod 41 therein.

During assembly of the input unit 10, first, fix the press key 60 on the PCB 20 by using the retaining bracket 70; second, fit the rotary dial 50 over the press key 60; third, fit a spring 30 over the rod 41; forth, fit the housing 40 over the rotary dial 50; finally, connect the housing 40 to the PCB 20 by screws. After assembly, top parts of the rotary dial 50 and the press key 60 are exposed for receiving user operations, the spring 30 engages with a tooth 54 of the rotary dial 50.

The press key 60 can be pressed down for actuating a corresponding contact 22, thus to produce a press input. When the rotary dial 50 rotates, the elastic piece 55 slides on the encoder circuit 21 and causes the encoder circuit 21 to produce a rotary dial input. When the rotary dial 50 is rotated, the spring 30 contracts and expands in turn, thus to produce a rotation feedback to the user.

Referring to FIG. 5, light emitted by the light sources 23 are reflected by the reflective surface 56, thus to illuminate the whole light transmissive rotary dial 50 evenly.

Moreover, it is to be understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A combination input unit comprising:

a printed circuit board accommodating an encoder circuit, a plurality of contacts, and a plurality of light sources;

a press key, disposed above the contacts, comprising a flange thereof;

a retaining bracket fitted over the press key and comprising a pin extending downwardly from the bracket to connect the press key to the printed circuit board;

a light transmissive rotary dial rotatably fitted over the press key and comprising a gear with a plurality of teeth, wherein the rotary dial is positioned above the encoder circuit, and comprises at least one elastic piece resiliently pressing the encoder circuit and a reflective surface, wherein the reflective surface is positioned on a sidewall of the top part; light emitted by the light sources are reflected by the reflective surface, thus to illuminate the whole rotary dial, and when the rotary dial rotates, the elastic piece slides on the encoder circuit and causes the encoder circuit to produce a rotary dial input;

a spring engaging with one of the plurality of teeth, wherein when the rotary dial is rotated, the spring contracts and expands in turn, thus producing a rotation feedback; and a housing receiving the press key, the retaining bracket, the rotary dial, the spring and the printed circuit board.

2. The combination input unit of claim 1, wherein the encoder circuit surrounds the light sources.

3. The combination input unit of claim 1, wherein the encoder circuit surrounds the contacts.

* * * * *